United States Patent
Yu

(10) Patent No.: US 7,214,032 B2
(45) Date of Patent: May 8, 2007

(54) HEAT DISSIPATING DEVICE

(75) Inventor: Po Yuan Yu, Taipei Hsien (TW)

(73) Assignee: Bestec Power Electronics Co., Ltd., Sanchong, Taipei Hsien (TW)

( * ) Notice: Subject to any disclaimer, the term of this patent is extended or adjusted under 35 U.S.C. 154(b) by 185 days.

(21) Appl. No.: 11/114,849

(22) Filed: Apr. 26, 2005

(65) Prior Publication Data

US 2006/0238977 A1    Oct. 26, 2006

(51) Int. Cl.
*F01D 25/24* (2006.01)

(52) U.S. Cl. .................. 415/213.1; 415/220; 415/214.1

(58) Field of Classification Search ............. 415/213.1, 415/214.1, 220; 416/244 R, 247 R
See application file for complete search history.

(56) References Cited

U.S. PATENT DOCUMENTS 5,579,827 A    12/1996   Chung  ...................... 165/80.3
5,713,790 A *  2/1998   Lin  ........................ 415/213.1
5,788,566 A *  8/1998   McAnally et al.  ....... 415/213.1
5,864,464 A    1/1999   Lin  ............................ 361/697
6,074,296 A *  6/2000   Wu  ............................ 454/184
6,579,062 B2 * 6/2003   Lu et al.  .................. 415/213.1
6,921,328 B1 * 7/2005   Nohara et al.  .......... 416/247 R

* cited by examiner

*Primary Examiner*—Igor Kershteyn
(74) *Attorney, Agent, or Firm*—Charles E. Baxley

(57) ABSTRACT

A heat dissipating device includes an object, a housing having a chamber for receiving a driving device which includes a spindle extended out of the housing, a fan device is attached to the spindle of the driving device, for being rotated and driven by the driving device. A cap includes a locking device for locking the cap to the housing, to attach and to secure the housing to the object. The cap includes one or more catches engageable into lock notches of the housing, for securing the housing to the object with the catch. A guide arm may be attached to the housing for receiving one or more electrical cables.

7 Claims, 2 Drawing Sheets

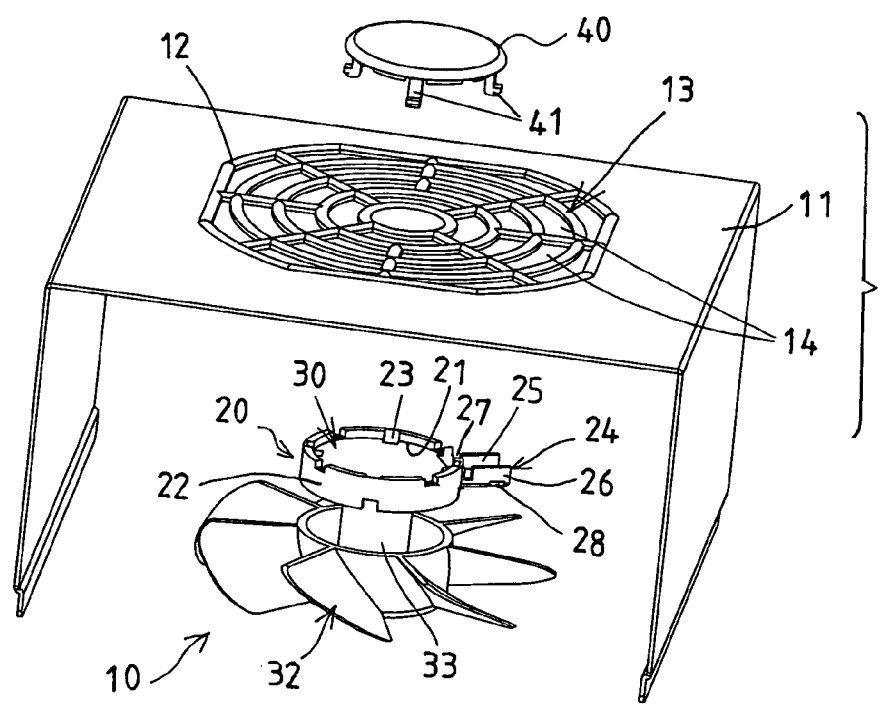
FIG. 1
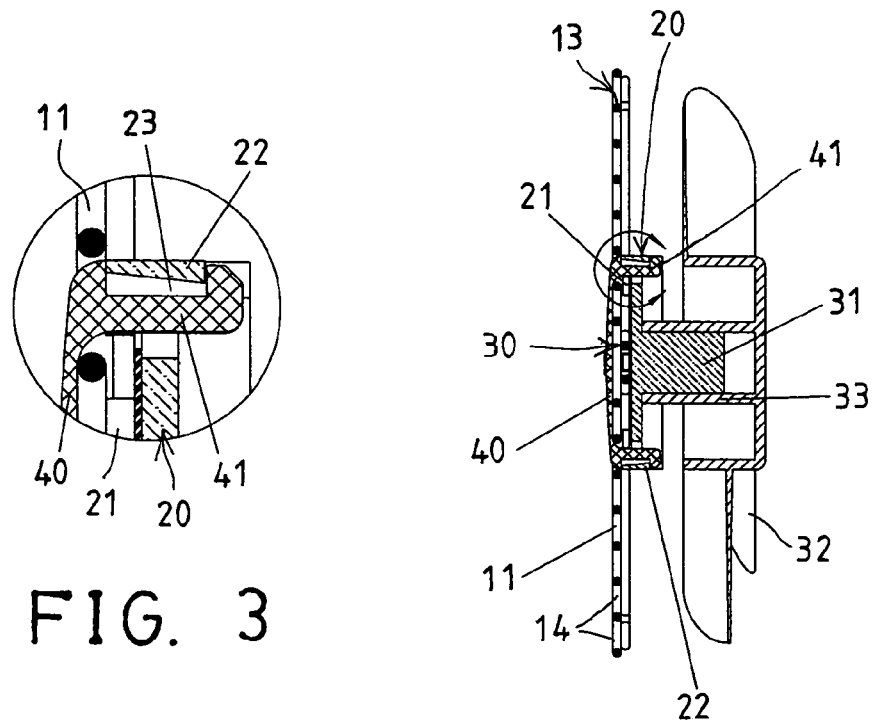
FIG. 3
FIG. 2

HEAT DISSIPATING DEVICE

BACKGROUND OF THE INVENTION

1. Field of the Invention

The present invention relates to a heat dissipating device, and more particularly to a heat dissipating device having a structure for easily attaching or securing to supporting objects.

2. Description of the Prior Art

Typical objects, such as computer facilities, integrated circuits, processor facilities, or the like may generate a great heat while working, such that one or more typical heat dissipating devices or heat sink assemblies are required to be attached onto the computer facilities, the integrated circuits, the processor facilities, or the like, for dissipating the heat from the objects.

For example, U.S. Pat. No. 5,579,827 to Chung, and U.S. Pat. No. 5,864,464 to Lin disclose two of the typical heat dissipating devices or heat sink assemblies and each comprises a fan device disposed in a fan housing, and the fan housing is then secured onto the objects with four fasteners.

However, it is difficult to snugly fit and to smoothly support the fan device within the fan housing. In addition, additional driving tools are required for rotating or for driving the fasteners, in order to attach or to secure the fan housing onto the objects. Furthermore, the air drawing or propelling effect of the fan device may be limited by the fan housing.

The provision and the attachment of the fan device within the fan housing may increase the inconvenience for assembling the fan device, and may greatly increase the manufacturing cost for the typical heat dissipating devices or the typical heat sink assemblies.

The present invention has arisen to mitigate and/or obviate the afore-described disadvantages of the conventional heat dissipating devices.

SUMMARY OF THE INVENTION

The primary objective of the present invention is to provide a heat dissipating device including a structure for easily attaching or securing to various supporting objects.

In accordance with one aspect of the invention, there is provided a heat dissipating device comprising an object, a housing including a chamber formed therein, a driving device received in the chamber of the housing, and including a spindle extended out of the housing, a fan device attached to the spindle of the driving device, for being rotated and driven by the driving device, a cap, and a locking device for locking the cap to the housing, to attach and to secure the housing to the object.

The housing includes one or more lock notches formed therein, the locking device includes one or more catches extended from the cap, and engageable into the lock notches of the housing, for securing the housing to the object with the catch. The object includes one or more openings formed therein, the catch of the cap is engaged through the openings of the object.

The housing includes a coupler extended therefrom, and a guide arm attached to the coupler of the housing and having a groove formed therein for receiving an electrical cable therein. The coupler of the housing includes a channel formed therein and defined between two side fences, and the guide arm includes a coupler engaged into the channel of the coupler of the housing.

The coupler of the housing includes one or more recesses and/or one or more cavities formed therein, and the guide arm includes one or more projections and/or one or more hooks extended therefrom, for engaging into the recesses and/or the cavities of the coupler of the housing, for attaching the guide arm to the coupler of the housing.

Further objectives and advantages of the present invention will become apparent from a careful reading of the detailed description provided hereinbelow, with appropriate reference to the accompanying drawings.

BRIEF DESCRIPTION OF THE DRAWINGS

FIG. 1 is a partial exploded view of a heat dissipating device in accordance with the present invention;

FIG. 2 is a partial cross sectional view of the heat dissipating device;

FIG. 3 is an enlarged partial cross sectional view of the heat dissipating device;

DETAILED DESCRIPTION OF THE PREFERRED EMBODIMENT

Figure 4:
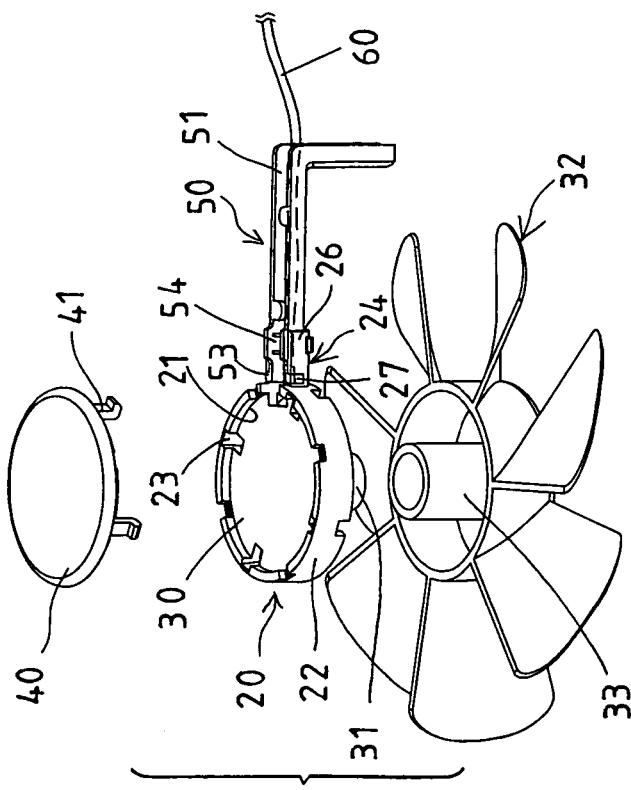
FIG. 4 is another partial exploded view of the heat dissipating device.

Referring to the drawings, and initially to FIGS. 1–4, a heat dissipating device 10 in accordance with the present invention comprises a supporting object 11, such as a frame 11 including a net or spider structure or device 12 formed or provided therein, and defined by ribs 13 and openings 14.

The heat dissipating device 10 further includes a housing 20 having a chamber 21 formed therein and defined by an outer peripheral wall 22, for receiving a typical driving means or device 30 therein. The housing 20 further includes one or more lock notches 23 formed therein.

Figure 5:
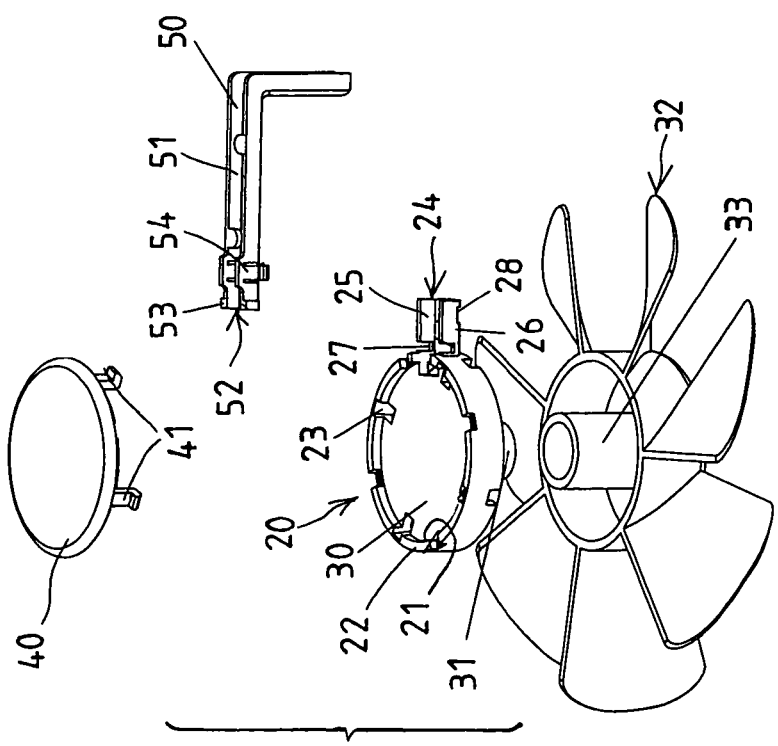
FIG. 5 is a further partial exploded view of the heat dissipating device, illustrating the operation of the heat dissipating device.

The driving means or device 30 may be a motor 30, or a rotor-and-induction coil mechanism 30, which includes a rotor or a spindle 31 extended out of the housing 20 (FIGS. 2 and 4–5). A fan device 32 includes a hub 33 for attaching or securing to the spindle 31 of the driving device 30, for being rotated or driven by the driving device 30.

A cap 40 includes one or more catches 41 extended therefrom, for engaging through the openings 14 of the net or spider structure or device 12 of the frame 11 or the supporting object 11, and engageable into the corresponding lock notches 23 of the housing 20, for readily and quickly attach and secure the housing 20 to the supporting object 11 with the catches 41, without additional fasteners and driving tools.

The housing 20 includes a coupler 24 extended therefrom, and having a channel 25 formed therein and defined between two side fences 26, and having one or more recesses 27 and one or more cavities 28 formed in each of the side fences 26, for coupling or for attaching a guide arm 50 thereto.

As shown in FIGS. 4 and 5, the guide arm 50 may include an L-shaped structure, and may include a groove 51 formed therein for receiving one or more electrical wires or cables 60 therein, and includes a coupler 52 formed or provided on one end thereof, for coupling or attaching to the coupler 24 of the housing 20.

For example, the coupler 52 of the guide arm 50 may be engaged into the channel 25 of the coupler 24, and may include one or more projections 53 and/or one or more hooks 54 extended therefrom, for engaging into or with the corresponding recesses 27 and/or cavities 28 of the side fences 26 of the coupler 24, and for solidly coupling or attaching the coupler 52 of the guide arm 50 to the coupler 24 of the housing 20.

In operation, as shown in FIGS. 1–3, the hub 33 of the fan device 32 may be attached or secured to the spindle 31 of the driving device 30, for being rotated or driven by the driving device 30. The housing 20 may then be attached and secured to the supporting object 11 with the catches 41 of the cap 40, without additional fasteners and driving tools.

The electrical wires or cables 60 may be received within the groove 51 of the guide arm 50, and may thus be supported by the guide arm 50 and separated from the fan device 32, for preventing the electrical wires or cables 60 from interfering the operation of the fan device 32.

It is to be noted that the catches 41 are shown to be extended from the cap 40 for engaging through the openings 14 of the net or spider structure or device 12 of the supporting object 11, and for engaging into the corresponding lock notches 23 of the housing 20, to attach and secure the housing 20 to the supporting object 11 with the catches 41.

However, on the contrary, the catches 41 may also be extended from the housing 20 for engaging through the openings 14 of the net or spider structure or device 12 of the supporting object 11, and for engaging into the corresponding lock notches of the cap 40, and thus for attaching and securing the housing 20 to the supporting object 11 with the catches 41. The catches 41 of the housing 20 or the cap 40 and the corresponding lock notches 23 of the cap 40 or of the housing 20 may thus be formed as an anchoring means or a locking means for locking the housing 20 to the object 11.

Accordingly, the heat dissipating device in accordance with the present invention includes a structure for easily attaching or securing to various supporting objects.

Although this invention has been described with a certain degree of particularity, it is to be understood that the present disclosure has been made by way of example only and that numerous changes in the detailed construction and the combination and arrangement of parts may be resorted to without departing from the spirit and scope of the invention as hereinafter claimed.

I claim:

1. A heat dissipating device comprising:
an object,
a housing including a chamber formed therein,
a driving device received in said chamber of said housing, and including a spindle extended out of said housing,
a fan device attached to said spindle of said driving device, for being rotated and driven by said driving device,
a cap, and
means for locking said cap to said housing, to attach and to secure said housing to said object.

2. The heat dissipating device as claimed in claim 1, wherein said housing includes at least one lock notch formed therein, said locking means includes at least one catch extended from said cap, and engageable into said at least one lock notch of said housing, for securing said housing to said object with said at least one catch.

3. The heat dissipating device as claimed in claim 2, wherein said object includes at least one opening formed therein, said at least one catch of said cap is engaged through said at least one opening of said object.

4. The heat dissipating device as claimed in claim 1, wherein said housing includes a coupler extended therefrom, and a guide arm attached to said coupler of said housing and having a groove formed therein for receiving an electrical cable therein.

5. The heat dissipating device as claimed in claim 4, wherein said coupler of said housing includes a channel formed therein and defined between two side fences, and said guide arm includes a coupler engaged into said channel of said coupler of said housing.

6. The heat dissipating device as claimed in claim 5, wherein said coupler of said housing includes at least one recess formed therein, and said guide arm includes at least one projection extended therefrom, for engaging into said at least one recess of said coupler of said housing, for attaching said guide arm to said coupler of said housing.

7. The heat dissipating device as claimed in claim 5, wherein said coupler of said housing includes at least one cavity formed therein, and said guide arm includes at least one hook extended therefrom, for engaging into said at least one cavity of said coupler of said housing, for attaching said guide arm to said coupler of said housing.

* * * * *